(12) United States Patent
Li

(10) Patent No.: US 11,460,941 B2
(45) Date of Patent: Oct. 4, 2022

(54) TOUCH DISPLAY PANEL

(71) Applicant: Wuhan China Star Optoelectronics Semiconductor Display Technology Co., Ltd., Hubei (CN)

(72) Inventor: Shuang Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/274,831

(22) PCT Filed: Apr. 2, 2019

(86) PCT No.: PCT/CN2019/080931
§ 371 (c)(1),
(2) Date: Mar. 10, 2021

(87) PCT Pub. No.: WO2020/124862
PCT Pub. Date: Jun. 25, 2020

(65) Prior Publication Data
US 2022/0057877 A1    Feb. 24, 2022

(30) Foreign Application Priority Data
Dec. 17, 2018   (CN) .......................... 201811544805.7

(51) Int. Cl.
*G06F 3/041*   (2006.01)
*G09G 3/3208*   (2016.01)
(Continued)

(52) U.S. Cl.
CPC ......... *G06F 3/0412* (2013.01); *G09G 3/3208* (2013.01); *H01L 27/323* (2013.01);
(Continued)

(58) Field of Classification Search
CPC ................ G06F 3/0412; G09G 3/3208; G09G 2300/0809; G09G 2310/0283;
(Continued)

(56) References Cited

U.S. PATENT DOCUMENTS

2014/0210790 A1   7/2014  Shin
2016/0054836 A1   2/2016  Wu et al.
(Continued)

FOREIGN PATENT DOCUMENTS

CN   105045433   11/2015
CN   105446514   3/2016
(Continued)

OTHER PUBLICATIONS

English Translation of CN 104571696 (Year: 2015).*
(Continued)

*Primary Examiner* — Patrick N Edouard
*Assistant Examiner* — Eboni N Giles

(57) ABSTRACT

A touch display panel comprises a base substrate, a thin film transistor device structure, an organic light-emitting diode device structure, a packaging structure, and a touch screen structure that are sequentially arranged from bottom to top. The touch display panel further comprises a first induction electrode lead and a second induction electrode lead, wherein the first induction electrode lead is provided in the touch screen structure; the second induction electrode lead is provided in the thin film transistor device structure; and the first induction electrode lead is electrically connected to the second induction electrode lead.

18 Claims, 2 Drawing Sheets

(51) Int. Cl.
*H01L 27/32* (2006.01)
*H01L 51/52* (2006.01)

(52) U.S. Cl.
CPC ...... *H01L 27/3246* (2013.01); *H01L 27/3262* (2013.01); *H01L 27/3276* (2013.01); *H01L 51/5253* (2013.01); *G09G 2300/0809* (2013.01); *G09G 2310/0283* (2013.01)

(58) Field of Classification Search
CPC ............... H01L 27/323; H01L 27/3246; H01L 27/3262; H01L 27/3276; H01L 51/5253
See application file for complete search history.

(56) References Cited

U.S. PATENT DOCUMENTS

| | | | | |
|---|---|---|---|---|
| 2018/0301475 | A1* | 10/2018 | Chien | ............... H01L 27/14812 |
| 2019/0181206 | A1* | 6/2019 | Cao | ..................... H01L 51/5221 |
| 2019/0187844 | A1 | 6/2019 | Ye | |
| 2019/0377445 | A1* | 12/2019 | Jeong | ....................... G06F 3/047 |
| 2020/0249795 | A1* | 8/2020 | Wang | ..................... G06F 3/0446 |
| 2020/0303467 | A1* | 9/2020 | Feng | ..................... H01L 27/323 |

FOREIGN PATENT DOCUMENTS

| | | |
|---|---|---|
| CN | 105514119 | 4/2016 |
| CN | 107870697 | 4/2018 |
| CN | 207232923 | 4/2018 |
| CN | 108110033 | 6/2018 |
| CN | 108400254 | 8/2018 |
| CN | 108550612 | 9/2018 |

OTHER PUBLICATIONS

English Translation of CN 107291295 (Year: 2017).*
English Translation of CN 107256869 (Year: 2017).*
English Translation of CN 206322134 (Year: 2017).*
International Search Report and the Written Opinion dated Sep. 17, 2019 From the International Searching Authority Re. Application No. PCT/CN2019/080931 and Its Translation of Search Report Into English. (8 Pages).

* cited by examiner

TOUCH DISPLAY PANEL

RELATED APPLICATIONS

This application is a National Phase of PCT Patent Application No. PCT/CN2019/080931 having International filing date of Apr. 2, 2019, which claims the benefit of priority of Chinese Patent Application No. 201811544805.7 filed on Dec. 17, 2018. The contents of the above applications are all incorporated by reference as if fully set forth herein in their entirety.

FIELD AND BACKGROUND OF THE INVENTION

The present disclosure relates to a technical field of display devices, and more particularly to a touch display panel.

With the rapid development of display technology, touch screen panels have been gradually increased throughout the life of people. Compared with a conventional display device capable of providing a display function, a display device using a touch screen can enable information interaction between a user and a display control host. Therefore, the touch screen panels can completely or at least partially replace common input devices, such that the conventional display device can perform not only the display function, but also the touch control.

An active matrix organic light-emitting diode (AMOLED) panel is often used in a touch screen panel, where for an AMOLED panel, ultra-thin and ultra-narrow technology is one of the development trends. The ultra-narrow bezel design may effectively improve the screen occupation ratio of the panel. The larger the screen occupation ratio of the panel, the larger the screen that can be used in the same volume of the panel, or the screen size is reduced when the volume of the panel is unchanged. The AMOLED panel is more convenient to carry, the weight is relatively light, and the experience of the touch control is better.

FIG. 1 illustrates a touch screen structure of the AMOLED panel, where a driving electrode lead 13 and an induction electrode lead 12 are respectively connected to two sides of an integrated circuit 15 (IC), and a data line 14 at an active area 11 (i.e., AA region) leads to an intermediate position of the IC 15. Because the single-side leads corresponding to the induction electrode lead 12 are relatively large, a width of the lower bezel of a touch screen can be increased by wires of the touch screen side to the induction electrode lead 12 of the IC 15, thereby affecting the width of the overall lower bezel of the AMOLED panel.

In a touch display panel of the prior art, a number of the single-side leads of the induction electrode lead 12 is greater, thereby increasing the width of the bezel, such that the screen occupation ratio of the panel is difficult to improve.

In a touch screen structure of the AMOLED panel, a driving electrode lead and an induction electrode lead are respectively connected to two sides of an integrated circuit (IC), and a data line at an active area (i.e., AA region) leads to an intermediate position of the IC. Because the single-side leads corresponding to the induction electrode are relatively large, a width of the lower bezel of a touch screen can be increased by wires of the touch screen side to the induction electrode lead of the IC, thereby affecting the width of the overall lower bezel of the AMOLED panel, such that the screen occupation ratio of the panel is difficult to improve.

SUMMARY OF THE INVENTION

In order to solve above-mentioned technical problems, the present disclosure provides a touch display panel, comprising:

a substrate, a thin film transistor device structure, an organic light-emitting diode device structure, a packaging structure, and a touch screen structure sequentially arranged from bottom to top; and a first induction electrode lead arranged in the touch screen structure, a second induction electrode lead arranged in the thin film transistor device structure, wherein the first induction electrode lead is electrically connected with the second induction electrode lead.

In an embodiment of the touch display panel, the touch display panel comprises:

an operational region and a lower frame region arranged beside the operational region.

In an embodiment of the touch display panel, the thin film transistor device structure is arranged on the substrate, and the thin film transistor device structure comprises:

a first buffer layer arranged on the substrate;
a second buffer layer arranged on the first buffer layer;
an active layer arranged on the second buffer layer;
a first gate insulating layer covering the active layer;
a first gate layer arranged on the first gate insulating layer;
a second gate insulating layer covering the first gate layer;
a second gate layer arranged on the second gate insulating layer;
a source/drain layer arranged on the insulation isolation layer and penetrating through the insulation isolation layer, wherein the second gate insulating layer is connected with the active layer, and the first gate insulating layer is connected with the active layer; and In an embodiment of the touch display panel, in the lower frame region, the second induction electrode lead is further arranged on the planarization layer, and a data line is further arranged on the second gate insulating layer.

a planarization layer covering the source/drain layer.
an organic light-emitting diode arranged on the anode layer; and In an embodiment of the touch display panel, the organic light-emitting diode device structure is arranged on the thin-film transistor device structure, and the organic light-emitting diode device structure comprises:

an anode layer arranged on the planarization layer and passing through the planarization layer for being connected with the source/drain layer;
an insulation isolation layer covering the second gate layer;
a pixel definition layer covering the organic light-emitting diode.

In an embodiment of the touch display panel, in the lower frame region, the anode layer passes through the planarization layer and is connected with the second induction electrode lead.

In an embodiment of the touch display panel, the packaging structure is arranged on the organic light-emitting diode device structure;

a photo spacer layer arranged on the pixel definition layer;
a cathode layer covering the photo spacer layer; and
a thin film packaging layer covering the cathode layer and the photo spacer layer.

In an embodiment of the touch display panel, the touch screen structure is arranged on the packaging structure and comprises:

a first insulating layer covering the thin film packaging layer;

a second insulating layer covering the first insulating layer; and a passivation layer covering the second insulating layer.

In an embodiment of the touch display panel, in the lower frame region, the first induction electrode lead is further arranged on the second insulating layer, the first induction electrode lead passes through the first insulating layer, the pixel definition layer, and the planarization layer.

In an embodiment of the touch display panel, the touch display panel further comprises a driving electrode lead and an induction electrode lead arranged in the operational area, wherein the driving electrode lead and the induction electrode lead are arranged in a staggered mode in a metal net mode, and the driving electrode is an up-and-down bidirectional driving structure, and the induction electrode lead is a one-way driving structure.

The present disclosure further provides a touch display panel, comprising:

a substrate, a thin film transistor device structure, an organic light-emitting diode device structure, a packaging structure and a touch screen structure sequentially arranged from bottom to top;

a first induction electrode lead arranged in the touch screen structure, a second induction electrode lead arranged in the thin film transistor device structure, wherein the first induction electrode lead is electrically connected with the second induction electrode lead.

wherein the touch display panel comprises an operational region and a lower frame region arranged beside the operational region; and wherein the touch display panel further comprises a driving electrode lead and an induction electrode lead arranged in the operational area, and the driving electrode lead and the induction electrode lead are arranged in a staggered mode in a metal net mode.

In an embodiment of the touch display panel, the thin film transistor device structure is arranged on the substrate, and the thin film transistor device structure comprises:

a first buffer layer arranged on the substrate;
a second buffer layer arranged on the first buffer layer;
an active layer arranged on the second buffer layer;
a first gate insulating layer covering the active layer;
a first gate layer arranged on the first gate insulating layer;
a second gate insulating layer covering the first gate layer;
a second gate layer arranged on the second gate insulating layer;
an insulation isolation layer covering the second gate layer;
a source/drain layer arranged on the insulation isolation layer and penetrating through the insulation isolation layer, wherein the second gate insulating layer is connected with the active layer, and the first gate insulating layer is connected with the active layer; and
a planarization layer covering the source/drain layer.

In an embodiment of the touch display panel, in the lower frame region, the second induction electrode lead is further arranged on the planarization layer, and a data line is further arranged on the second gate insulating layer.

In an embodiment of the touch display panel, the organic light-emitting diode device structure is arranged on the thin-film transistor device structure, and the organic light-emitting diode device structure comprises:

an anode layer arranged on the planarization layer and passing through the planarization layer for being connected with the source/drain layer;

an organic light-emitting diode arranged on the anode layer; and a pixel definition layer covering the organic light-emitting diode.

In an embodiment of the touch display panel, in the lower frame region, the anode layer passes through the planarization layer and is connected with the second induction electrode lead.

In an embodiment of the touch display panel, the packaging structure is arranged on the organic light-emitting diode device structure;

a photo spacer layer arranged on the pixel definition layer;
a cathode layer covering the photo spacer layer; and
a thin film packaging layer covering the cathode layer and the photo spacer layer.

In an embodiment of the touch display panel, the touch screen structure is arranged on the packaging structure and comprises:

a first insulating layer covering the thin film packaging layer;

a second insulating layer covering the first insulating layer; and a passivation layer covering the second insulating layer.

In an embodiment of the touch display panel, in the lower frame region, the first induction electrode lead is further arranged on the second insulating layer, the first induction electrode lead passes through the first insulating layer, the pixel definition layer, and the planarization layer.

In an embodiment of the touch display panel, the driving electrode is an up-and-down bidirectional driving structure, and the induction electrode lead is a one-way driving structure.

Compared with the prior art, the present disclosure solves the technical problems. The present disclosure provides a touch display panel to reduce the number of wires of a single-layer induction electrode, such that a size of the lower frame region is reduced and the screen occupation ratio of the touch display panel is further improved.

DESCRIPTION OF SPECIFIC EMBODIMENTS OF THE INVENTION

Figure 1:
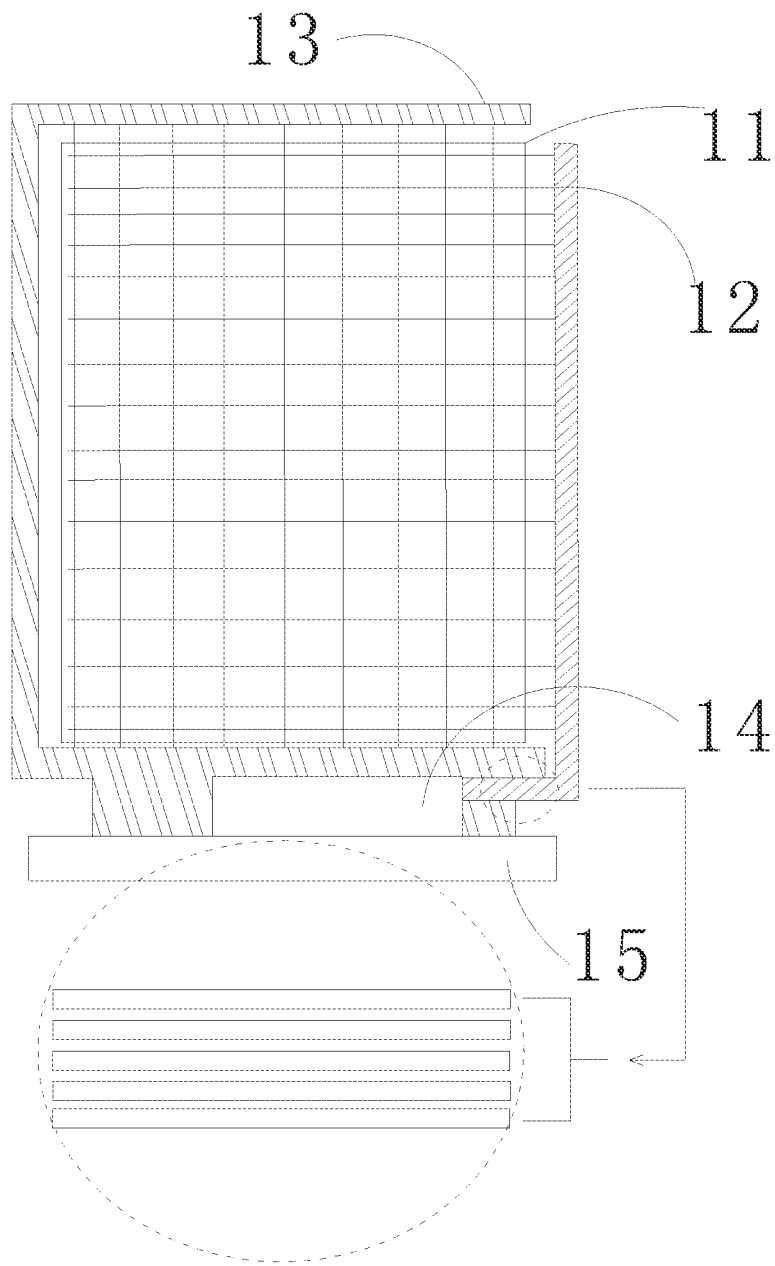
FIG. 1 is a schematic structural diagram of an AMOLED panel touch screen in the prior art.

The following embodiments refer to the accompanying figures for exemplifying specific implementable embodiments of the present disclosure in a suitable environment.

It should be noted that the exemplary described embodiments are configured to describe and understand the present disclosure, but the present disclosure is not limited thereto. Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure.

In the figures, units having similar structures are used for the same reference numbers.

According to an embodiment of the present disclosure, a touch display panel includes a substrate 21, a thin film transistor device structure 22, an organic light-emitting diode device structure 23, a packaging structure 24, and a touch screen structure 25, which are sequentially arranged from bottom to top.

Figure 2:
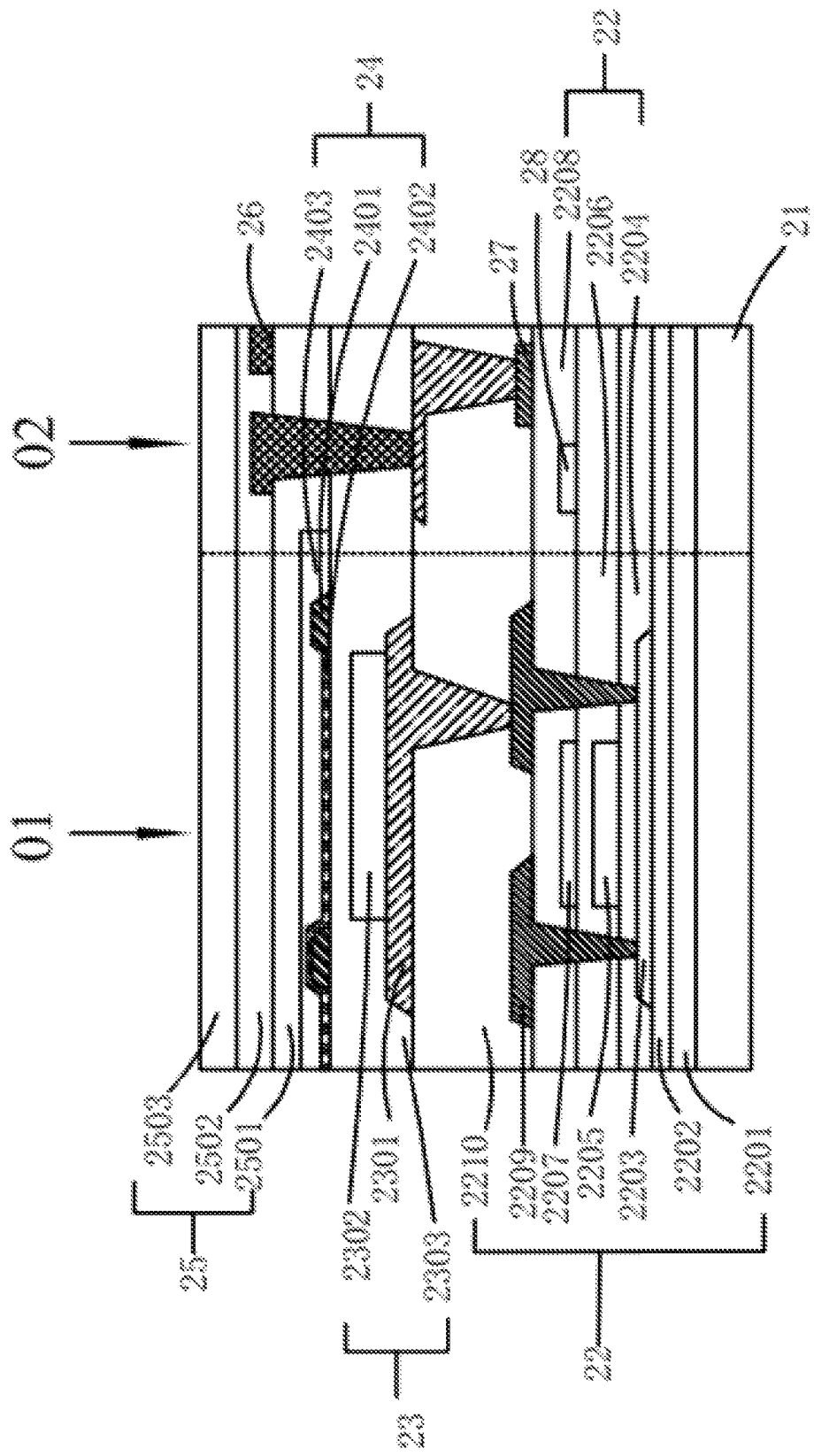
FIG. 2 is a schematic cross-sectional diagram of an AMOLED panel according to an embodiment of the present disclosure.

FIG. 2 illustrates a cross-sectional diagram of an active matrix organic light-emitting diode (AMOLED) panel according to an embodiment of the present disclosure.

As shown in FIG. 2, a bottom layer is a substrate 21 and a thin film transistor (TFT) is disposed on the substrate 21. The thin film transistor device 22 includes a first buffer layer 2201, a second buffer layer 2202, an active layer 2203, a first gate insulating layer 2204, a first gate layer 2205, a second gate insulating layer 2206, a second gate layer 2207, an insulation isolation layer 2208, a source/drain layer 2209, and a planarization layer 2210. The first buffer layer 2201 is formed on the substrate 21, and the second buffer layer 2202 is formed on the first buffer layer 2201. The touch display panel according to an embodiment of the present disclosure includes an operational region 01 (e.g., an active area 01 (i.e., an AA region) and a lower frame region 02 arranged beside the operational region 01. In the AA region 01 of the touch display panel according to an embodiment of the present disclosure, the active layer 2203 is formed on the second buffer layer 2202, the first gate insulating layer 2204 is formed on the active layer 2203, and the first gate insulating layer 2204 completely covers the active layer 2203. The first gate layer 2205 is formed on the first gate insulating layer 2204, and the second gate insulating layer 2206 covers the first gate layer 2205 and is connected to the first gate insulating layer 2204. The second gate layer 2207 is formed on the second gate insulating layer 2206, and the insulation isolation layer 2208 covers the second gate layer 2207. The insulation isolation layer 2208 is connected with the second gate insulating layer 2206. The source/drain layer 2209 is formed on the insulation isolation layer 2208. The source/drain layer 2209 penetrates through the insulation isolation layer 2208, the second gate insulating layer 2206, and the first gate insulating layer 2204, and is connected with the active layer 2203. The planarization layer 2210 is formed on the source drain layer 2209.

In the lower frame region 02 of the touch display panel, a data line 28 is further arranged on the second gate insulating layer 2206, and a second induction electrode lead 27 is further arranged on the planarization layer 2210.

An organic light-emitting diode (OLED) device structure 23 is formed on a device structure of a thin film transistor 22. An anode layer 2301 (anode) is formed on the planarization layer 2210 that penetrates through the planarization layer 2210, and the anode layer 2301 is connected with the source/drain layer 2209. A light-emitting diode 2302 (OLED) is formed on the anode layer 2301, and a pixel definition layer 2303 (PDL) is formed on the light-emitting diode 2302. In the lower frame region 02, the anode layer 2301 penetrates through the planarization layer 2210 and is connected with the second induction electrode lead 27.

The packaging structure 24 is formed on the organic light-emitting diode device structure 23. A photo spacer layer 2401 is formed on the pixel definition layer 2303. After the photo spacer layer 2401 is formed, a cathode layer 2402 is formed on the photo spacer layer 2401. A thin film packaging layer 2403 is formed, and the thin film packaging layer 2403 covers the cathode layer 2402 and the photo spacer layer 2401.

After the packaging structure 24 is manufactured, a touch screen structure 25 is formed on the packaging structure 24. The touch screen structure 25 includes three layers having a first insulating layer 2501, a second insulating layer 2502, and a passivation layer 2503. The first insulating layer 2501 is formed on the thin film packaging layer 2403, the second insulating layer 2502 is formed on the first insulating layer 2501, and the passivation layer 2503 is formed on the second insulating layer 2502. In the lower frame region of the touch display panel, a first induction electrode lead 26 is further arranged in the second insulating layer 2502. The first induction electrode lead 26 penetrates through the first insulating layer 2501, the pixel definition layer 2303, and the planarization layer 2210, and is electrically connected with the anode layer 2301. The second induction electrode lead 27 is arranged in the planarization layer 2210. The second induction electrode lead 27 is electrically connected with the anode layer 2301. In other words, the first induction electrode lead 26 is electrically connected with the second induction electrode lead 27 for forming a double-layer wiring of the induction electrode.

In the touch display panel of an embodiment of the present disclosure, a driving electrode lead 13 is further arranged in the operational region 01, the driving electrode lead 13 and the induction electrode lead 12 are arranged in a staggered mode in a metal net mode, where the driving electrode lead 13 is an up-and-down bidirectional driving structure, and the induction electrode lead 12 is a one-way driving structure.

In conclusion, although the present disclosure has been described in terms of preferred embodiments, the preferred embodiment of the present disclosure is not intended to limit the present disclosure, and one of ordinary skill in the art will recognize. Various changes and modifications can be made without departing from the spirit and scope of the disclosure. The protection scope of the disclosure is defined by the claims. While the disclosure has been illustrated and described with respect to one or more implementations, however, equivalent modifications and modifications will occur to those skilled in the art based on the reading and understanding of the specification and the accompanying drawings. The disclosure includes all such modifications and variations and is limited only by the scope of the appended claims. In particular, various functions performed by the above-described components are described, the terms used to describe such components are intended to correspond to specified functions that perform the described components (e.g., they are functionally equivalent) of any component (unless otherwise indicated) is not equal to the public structure of the function in the exemplary implementation mode for carrying out the present specification as shown herein. Furthermore, although specific features of the specification have been disclosed with respect to only one of several implementations, but such features may be combined with one or more other features of other implementations as may be desirable and advantageous for a given or particular application. In addition, the terms "comprising" and "having" are used, the "containing" or the deformation thereof is used in the specific implementation mode or the claims. Such terms are intended to be included in a manner similar to the term "comprising".

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A touch display panel, comprising:
a substrate, a thin film transistor device structure, an organic light-emitting diode device structure, a packaging structure, and a touch screen structure sequentially arranged from bottom to top, wherein the touch display panel comprises an operational region and a lower frame region arranged beside the operational region; and
a first induction electrode lead arranged in the touch screen structure in the lower frame region, a second induction electrode lead arranged in the thin film transistor device structure in the lower frame region, wherein the first induction electrode lead is electrically connected with the second induction electrode lead,
wherein the touch screen structure is arranged on the packaging structure and comprises:
a first insulating layer covering the packaging structure;
a second insulating layer covering the first insulating layer,
wherein in the operational region, the thin film transistor device structure is arranged on the substrate, and comprises:
an active layer arranged on the substrate;
a first gate layer arranged on the active layer;
a second gate layer arranged on the first gate layer;
a source/drain layer arranged on the second gate layer; and
a planarization layer covering the source/drain layer, and
wherein in the lower frame region, the first induction electrode lead is provided in the second insulating layer, the second induction electrode lead is provided on a side of the planarization layer close to the source/drain layer, the first induction electrode lead is electrically connected to an anode in the organic light-emitting diode device structure penetrating through the first insulating layer, the second induction electrode lead is electrically connected to the anode penetrating through the planarization layer, and the first induction electrode lead is electrically connected to the second induction electrode lead to forming a double-layer wiring.

2. The touch display panel according to claim 1, wherein the thin film transistor device structure further comprises:
a first buffer layer arranged on the substrate;
a second buffer layer arranged on the first buffer layer and between the first buffer layer and the active layer;
a first gate insulating layer covering the active layer and between the active layer and the first gate layer;
a second gate insulating layer covering the first gate layer and between the first gate layer and the second gate layer; and
an insulation isolation layer covering the second gate layer and between the second gate layer and the source/drain layer,
wherein the source/drain layer penetrates through the insulation isolation layer, the second gate insulating layer, and the first gate insulating layer and is connected with the active layer.

3. The touch display panel according to claim 2, wherein in the lower frame region, a data line is further arranged on the second gate insulating layer.

4. The touch display panel according to claim 2, wherein the organic light-emitting diode device structure is arranged on the thin-film transistor device structure, and the organic light-emitting diode device structure comprises:

an anode layer arranged on the planarization layer and passing through the planarization layer for being connected with the source/drain layer;
an organic light-emitting diode arranged on the anode layer; and
a pixel definition layer covering the organic light-emitting diode.

5. The touch display panel according to claim 4, wherein in the lower frame region, the anode layer passes through the planarization layer and is connected with the second induction electrode lead.

6. The touch display panel according to claim 4, wherein the packaging structure is arranged on the organic light-emitting diode device structure;
a photo spacer layer arranged on the pixel definition layer;
a cathode layer covering the photo spacer layer; and
a thin film packaging layer covering the cathode layer and the photo spacer layer.

7. The touch display panel according to claim 6, wherein the touch screen structure further comprises:
a passivation layer covering the second insulating layer.

8. The touch display panel according to claim 4, wherein in the lower frame region, the first induction electrode lead passes through the first insulating layer, the pixel definition layer, and the planarization layer.

9. The touch display panel according to claim 1, further comprising a driving electrode lead and an induction electrode lead arranged in the operational area, wherein the driving electrode lead and the induction electrode lead in the operational area are arranged in a staggered mode in a metal net mode, and a driving electrode has an up-and-down bidirectional driving structure, and a induction electrode lead has a one-way driving structure.

10. A touch display panel, comprising:
a substrate, a thin film transistor device structure, an organic light-emitting diode device structure, a packaging structure and a touch screen structure sequentially arranged from bottom to top, wherein the touch display panel comprises an operational region and a lower frame region arranged beside the operational region;
a first induction electrode lead arranged in the touch screen structure in the lower frame region, a second induction electrode lead arranged in the thin film transistor device structure in the lower frame region, wherein the first induction electrode lead is electrically connected with the second induction electrode lead,
wherein the touch display panel further comprises a driving electrode lead and an induction electrode lead arranged in the operational area, and the driving electrode lead and the induction electrode lead are arranged in a staggered mode in a metal net mode,
wherein the touch screen structure is arranged on the packaging structure and comprises:
a first insulating layer covering the packaging structure;
a second insulating layer covering the first insulating layer,
wherein in the operational region, the thin film transistor device structure is arranged on the substrate, and comprises:
an active layer arranged on the substrate;
a first gate layer arranged on the active layer;
a second gate layer arranged on the first gate layer;
a source/drain layer arranged on the second gate layer; and
a planarization layer covering the source/drain layer, and wherein in the lower frame region, the first induction electrode lead is provided in the second insulating layer, the second induction electrode lead is provided on a side of the planarization layer close to the source/drain layer, the first induction electrode lead is electrically connected to an anode in the organic light-emitting diode device structure penetrating through the first insulating layer, and the second induction electrode lead is electrically connected to the anode penetrating through the planarization layer, and the first induction electrode lead is electrically connected to the second induction electrode lead to forming a double-layer wiring.

11. The touch display panel according to claim 10, wherein the thin film transistor device structure further comprises:
   a first buffer layer arranged on the substrate;
   a second buffer layer arranged on the first buffer layer and between the first buffer layer and the active layer;
   a first gate insulating layer covering the active layer and between the active layer and the first gate layer;
   a second gate insulating layer covering the first gate layer and between the first gate layer and the second gate layer; and
   an insulation isolation layer covering the second gate layer and between the second gate layer and the source/drain layer,
   wherein the source/drain layer penetrates through the insulation isolation layer, the second gate insulating layer, and the first gate insulating layer and is connected with the active layer.

12. The touch display panel according to claim 11, wherein in the lower frame region, a data line is further arranged on the second gate insulating layer.

13. The touch display panel according to claim 11, wherein the organic light-emitting diode device structure is arranged on the thin-film transistor device structure, and the organic light-emitting diode device structure comprises:
   an anode layer arranged on the planarization layer and passing through the planarization layer for being connected with the source/drain layer;
   an organic light-emitting diode arranged on the anode layer; and
   a pixel definition layer covering the organic light-emitting diode.

14. The touch display panel according to claim 13, wherein in the lower frame region, the anode layer passes through the planarization layer and is connected with the second induction electrode lead.

15. The touch display panel according to claim 13, wherein the packaging structure is arranged on the organic light-emitting diode device structure;
   a photo spacer layer arranged on the pixel definition layer;
   a cathode layer covering the photo spacer layer; and
   a thin film packaging layer covering the cathode layer and the photo spacer layer.

16. The touch display panel according to claim 15, wherein the touch screen structure further comprises:
   a passivation layer covering the second insulating layer.

17. The touch display panel according to claim 13, wherein in the lower frame region, the first induction electrode lead passes through the first insulating layer, the pixel definition layer, and the planarization layer.

18. The touch display panel according to claim 10, wherein a driving electrode has an up-and-down bidirectional driving structure, and a induction electrode lead has a one-way driving structure.

* * * * *